US006488767B1

(12) United States Patent
Xu et al.

(10) Patent No.: US 6,488,767 B1
(45) Date of Patent: Dec. 3, 2002

(54) HIGH SURFACE QUALITY GAN WAFER AND METHOD OF FABRICATING SAME

(75) Inventors: Xueping Xu, Stamford; Robert P. Vaudo, New Milford, both of CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/877,437

(22) Filed: Jun. 8, 2001

(51) Int. Cl.$^7$ ................................................ C30B 25/02
(52) U.S. Cl. ................... 117/2; 117/1; 117/90; 117/92; 117/97; 117/106; 117/109
(58) Field of Search .................... 117/1, 2, 90, 92, 117/97, 106, 109

(56) References Cited

U.S. PATENT DOCUMENTS

| 5,679,152 A | 10/1997 | Tischler et al. |
| 5,679,153 A | 10/1997 | Dmitriev et al. |
| 5,886,367 A | * 3/1999 | Udagawa ............... 257/64 |

OTHER PUBLICATIONS

P. Visconti, et al., "Dislocation density in GaN determined by photoelectrochemical and hot–wet etching", Applied Physics Letters, vol. 77, No. 22, Nov. 2000, pp. 3532–3534.
J.L. Weyher, et al., "Chemical polishing of bulk and epitaxial GaN", Journal of Crystal Growth, 182, (1997), pp. 17–22.
F. Karouta, et al., "Final Polishing of Ga–Polar GaN Substrates using Reactive Ion Etching", Journal of Electronic Materials, vol. 28, No. 12, 1999, pp. 1448–1451.
C.R. Miskys et al.,: MOCVD–Epitaxy on Free–Standing GaN Substrates, "MOCVD–Epitaxy on Free–Standing HVPE–GaN Substrates", Phys. Stat. Sol. (a), 176, 1999, pp. 443–446.
Hisao Sato, et al., "Surface Pretreatment of Bulk GaN for Homoepitaxial Growth by Metalorganic Chemical Vapor Deposition", Jpn. J. App. Phys., vol. 37 (1998), pp. 626–631.
Z. Liliental–Weber, et al., "Polarity of GaN", Mat. Res. Soc. Symp. Proc., vol. 512, 1998, pp. 363–368.
D.A. Stocker, et al., "Crystallographic wet chemical etching of GaN", Applied Physics Letters, vol. 73, No. 18, Nov. 2, 1998, pp. 2654–3745.

* cited by examiner

Primary Examiner—Felisa Hiteshew
(74) Attorney, Agent, or Firm—Oliver A. Zitzmann; William Ryann

(57) ABSTRACT

A high quality wafer comprising $Al_xGa_yIn_zN$, wherein $0<y\leq1$ and $x+y+z=1$, characterized by a root mean square surface roughness of less than 1 nm in a $10\times10$ $\mu m^2$ area at its Ga-side. Such wafer is chemically mechanically polished (CMP) at its Ga-side, using a CMP slurry comprising abrasive particles, such as silica or alumina, and an acid or a base. The process of fabricating such high quality $Al_xGa_yIn_zN$ wafer may include steps of lapping, mechanical polishing, and reducing internal stress of said wafer by thermal annealing or chemical etching for further enhancement of its surface quality. The CMP process is usefully employed to highlight crystal defects on the Ga-side of the $Al_xGa_yIn_zN$ wafer.

80 Claims, 5 Drawing Sheets

FIG.1
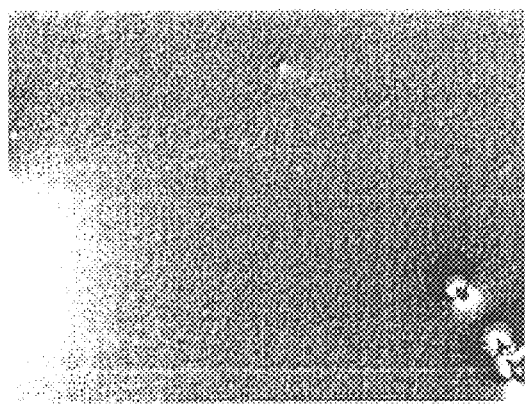
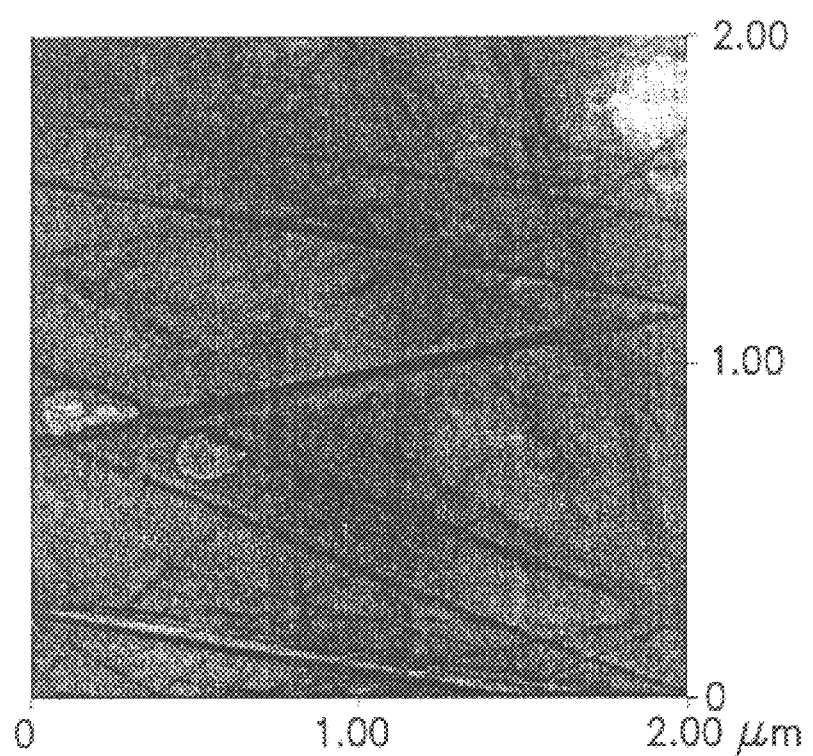
FIG.2

HIGH SURFACE QUALITY GAN WAFER AND METHOD OF FABRICATING SAME

GOVERNMENT RIGHTS IN INVENTION

The invention disclosed herein includes aspects that were first reduced to practice in the performance of United States Contract No. DASG60-00-C-0036 issued by the U.S. Army Space and Missle Defense Command and United States Contract No. N00014-00-3-0013 issued by The Office of Naval Research. The government has certain rights in the invention.

BACKGROUND OF THE INVENTION

I. Field of the Invention

This invention relates to an $Al_xGa_yIn_zN$ (wherein $0<y\leq 1$ and $x+y+z=1$) semiconductor wafer having superior surface quality at its Ga-side, and to a method of fabricating such E wafer.

II. Description of the Related Art

GaN and related GaN-like III-V nitride crystal films, represented by the general formula $Al_xGa_yIn_zN$, wherein $0<y\leq 1$ and $x+y+z=1$, are useful materials in various applications, such as high temperature electronics, power electronics, and optoelectronics (e.g., light emitting diodes (LEDs) and blue light laser diodes (LDs)). Blue light emitting diodes (LED's) and lasers are an enabling technology, allowing much higher storage density in magneto-optic memories and CDROM's and the construction of full color light emitting displays. Blue light emitting diodes may replace today's incandescent light bulbs in road and railway signals etc., where they promise very substantial cost and energy savings.

Currently, $Al_xGa_yIn_zN$ films are grown on non-native substrates such as sapphire or silicon carbide due to unavailability of high quality $Al_xGa_yIn_zN$ substrates. However, differences in thermal expansion and lattice constants between such foreign substrates and the $Al_xGa_yIn_zN$ crystals epitaxially grown thereon cause significant thermal stress and internal stress in the grown $Al_xGa_yIn_zN$ crystals. The thermal stress and internal stress cause micro-cracks, distortions, and other defects in the $Al_xGa_yIn_zN$ crystals, and make such $Al_xGa_yIn_zN$ crystals easy to break. Growing on lattice non-matched foreign substrates causes high density of lattice defects, leading to poor device performance.

In order to reduce the deleterious thermal stress and high defect density in the grown $Al_xGa_yIn_zN$ crystals, it is desirable to provide high quality freestanding $Al_xGa_yIn_zN$ wafers as film-growing substrates in place of the above-mentioned foreign substrates.

U.S. Pat. No. 5,679,152 entitled "Method for Making a Single Crystal Ga*N Article" and U.S. Pat. No. 5,679,153 entitled "Bulk Single Crystal Gallium Nitride and Method of Making Same" disclose a hydride vapor phase epitaxy (HVPE) process for fabricating freestanding $Al_xGa_yIn_zN$ crystals, which may advantageously be used as crystal-growing substrates for homoepitaxial growth of $Al_xGa_yIn_zN$ crystals thereon.

Since quality of a subsequently grown $Al_xGa_yIn_zN$ crystal is directly correlated to the quality of the substrate surface and near surface region on which the $Al_xGa_yIn_zN$ crystal is grown, it is important to provide a highly smooth initial substrate surface without any surface and subsurface damage.

However, after mechanical polishing, the $Al_xGa_yIn_zN$ crystals typically have very poor surface quality, with substantial surface and subsurface damage and polishing scratches. Additional wafer finish processing therefore is necessary to further enhance the surface quality of the freestanding $Al_xGa_yIn_zN$ crystal, so that it is suitable for high-quality epitaxial growth and device fabrication thereon.

Crystalline $Al_xGa_yIn_zN$ generally exists in a chemically stable wurtzite structure. The most common crystallographic orientation of $Al_xGa_yIn_zN$ compounds has two polar surfaces perpendicular to its c-axis: one side is N-terminated, and the other one is Ga-terminated (Ga hereinafter in the context of the Ga-side of the crystal structure being understood as generally illustrative and representative of alternative Group III ($Al_xGa_yIn_z$) crystalline compositions, e.g., of a corresponding $Ga_xIn_y$-side in $Ga_xIn_yN$ crystals, of a corresponding $Al_xGa_yIn_z$-side in $Al_xGa_yIn_zN$ crystals, and of a corresponding $Al_xGa_y$-side in $Al_xGa_yN$ crystals).

Crystal polarity strongly influences the growth morphology and chemical stability of the crystal surface. It has been determined that the N-side of the $Al_xGa_yIn_zN$ crystal is chemically reactive with KOH or NaOH-based solutions, whereas the Ga-side of such crystal is very stable and not reactive with most conventional chemical etchants. The N-side can therefore be easily polished, using an aqueous solution of KOH or NaOH, to remove surface damage and scratches left by the mechanical polishing process and to obtain a highly smooth surface.

The Ga-side ($Al_xGa_yIn_z$ side) of the $Al_xGa_yIn_zN$ crystal, on the other hand, remains substantially the same after contacting the KOH or NaOH solution, with its surface damage and scratches unaltered by such solution. See Weyher et al., "Chemical Polishing of Bulk and Epitaxial GaN", J. CRYSTAL GROWTH, vol. 182, pp. 17–22, 1997; also see Porowski et al. International Patent Application Publication No. WO 98/45511 entitled "Mechano-Chemical Polishing of Crystals and Epitaxial Layers of GaN and $Ga_{1-x-y}Al_xIn_yN$".

However, it has been determined that the Ga-side of the $Al_xGa_yIn_zN$ crystal is a better film-growing surface than the N-side. See Miskys et al., "MOCVD-Epitaxy on Free-Standing HVPE-GaN Substrates", PHYS. STAT. SOL. (A), vol. 176, pp. 443–46, 1999. It therefore is important to provide a wafer finish process that is particularly effective for preparing the Ga-side of the $Al_xGa_yIn_zN$ crystal to make it suitable for subsequent crystal growth thereupon.

Reactive ion etching (RIE) recently has been used to remove a layer of surface material from the Ga-side of an $Al_xGa_yIn_zN$ wafer to obtain smoother wafer surface. See Karouta et al., "Final Polishing of Ga-Polar GaN Substrates Using Reactive Ion Etching", J. ELECTRONIC MATERIALS, vol. 28, pp. 1448–51, 1999. However, such RIE process is unsatisfactory because it is ineffective for removing deeper scratches, and it introduces additional damage by ion bombardment and additional surface irregularities by concomitant contamination, which in turn requires additional cleaning of the GaN wafer in an $O_2$ plasma.

It is therefore advantageous to provide an $Al_xGa_yIn_zN$ wafer with high surface quality on its Ga-side, with substantially no or little surface and subsurface damage or contamination. It is also desirable that such $Al_xGa_yIn_zN$ wafer is prepared by a surface polishing process that is both economic and effective, and requires no cumbersome cleaning process during or after polishing.

SUMMARY OF THE INVENTION

The present invention generally relates to an $Al_xGa_yIn_zN$ (wherein $0<y\leq 1$ and $x+y+z=1$) wafer having superior surface quality at its Ga-side, and to a method of fabricating such wafer.

One aspect of the present invention relates to a high quality $Al_xGa_yIn_zN$ wafer of such type, wherein the wafer has a surface roughness characterized by a root means square (RMS) roughness of less than 1 nm in a 10×10 $\mu m^2$ area at its Ga-side.

In ranges of progressively increasing preference, the RMS surface roughness of such wafer at its Ga-side is within the following ranges: (1) less than 0.7 nm in a 10×10 $\mu m^2$ area; (2) less than 0.5 nm in a 10×10 $\mu m^2$ area; (3) less than 0.4 nm in a 2×2 $\mu m^2$ area; (4) less than 0.2 nm in a 2×2 $\mu m^2$ area; and (5) less than 0.15 nm in a 2×2 $\mu m^2$ area.

$Al_xGa_yIn_zN$ wafers according to the present invention preferably are characterized by a regular step structure at the Ga-side thereof when observed by atomic force microscope.

$Al_xGa_yIn_zN$ wafers according to the present invention preferably are characterized by that the crystal defects of the $Al_xGa_yIn_zN$ wafer at its Ga-side constitute small pits with diameters of less than 1 $\mu m$. Small pits of such size are readily visible by both atomic force microscope (AFM) and scanning electron microscope (SEM) techniques, while at the same time these pits do not constitute significant damage of the $Al_xGa_yIn_zN$ wafer surface and therefore do not impair quality of $Al_xGa_yIn_zN$ crystals subsequently grown thereon.

Such high quality $Al_xGa_yIn_zN$ crystal wafers are readily manufactured by chemically mechanically polishing (CMP) $Al_xGa_yIn_zN$ wafer blanks at the Ga-side thereof, using silica or alumina-containing CMP slurry compositions. The corresponding CMP process enables the crystal defects of the $Al_xGa_yIn_zN$ wafer (evidenced by small pits of less than 1 $\mu m$ in diameter) to be readily visualized.

Another aspect of the present invention relates to an epitaxial $Al_xGa_yIn_zN$ crystal structure, comprising an epitaxial $Al_{x'}Ga_{y'}In_{z'}N$ (wherein $0<y'\leq 1$ and $x'+y'+z'=1$) film grown on the above-described $Al_xGa_yIn_zN$ wafer of the invention. Such epitaxial $Al_xGa_yIn_zN$ crystal structure preferably comprises a wurtzite crystalline thin film, but may be in any other suitable form or structure suitable for specific semiconductor, electronic, or optoelectronic applications. The composition of the epitaxial film may be or may not be the same as the composition of the wafer substrate. The epitaxial $Al_xGa_yIn_zN$ crystal structure may comprise several epitaxial $Al_{x'}Ga_{y'}In_{z'}N$ films with different composition or doping sequentially grown on the above-described $Al_xGa_yIn_zN$ wafer of the invention. The epitaxial film may have graded composition, i.e., the composition of the epitaxial film varies with the distance from the interface between the substrate and epitaxial film. As used herein,. the term "thin film" means a material layer having a thickness of less than about 100 $\mu m$.

Yet another aspect of the present invention relates to an optoelectronic device that comprises at least one such epitaxial $Al_xGa_yIn_zN$ crystal structure grown on the above-described $Al_xGa_yIn_zN$ wafer of the invention.

A further aspect of the present invention relates to a microelectronic device that comprises at least one such epitaxial $Al_xGa_yIn_zN$ crystal structure grown on the above-described $Al_xGa_yIn_zN$ wafer of the invention.

A further aspect of the present invention relates to an $Al_xGa_yIn_zN$ boule that comprises epitaxial $Al_xGa_yIn_zN$ crystal structure grown on the above-described $Al_xGa_yIn_zN$ wafer of the invention. A boule is defined as that it can be sliced into at least two wafers. An $Al_xGa_yIn_zN$ boule can be grown with any suitable method such as hydride vapor phase epitaxy (HVPE), the metallorganic chloride (MOC) method, metallorganic chemical vapor deposition (MOCVD), sublimation, liquid phase growth, etc.

The invention in a further aspect contemplates a method of chemically mechanically polishing (CMP) an $Al_xGa_yIn_zN$ wafer at its Ga-side, using a CMP slurry comprising:

Abrasive amorphous silica particles having particle size of less than 200 nm;

at least one acid; and optionally, at least one oxidation agent;

wherein the pH value of the CMP slurry is in a range of from about 0.5 to about 4.

The abrasive amorphous silica particles in the CMP slurry may for example comprise fumed silica or colloidal silica. The amorphous silica particles in the CMP slurry preferably have an average particle size in the range from about 10 nm to about 100 nm. The CMP slurry of the invention in a preferred compositional aspect comprises at least one oxidation agent, e.g., hydrogen peroxide, dichloroisocyanuric acid, or the like.

The pH value of such CMP slurry preferably is in a range of from about 0.6 to about 3, and more preferably is in a range of from about 0.8 to about 2.5.

A further aspect of the present invention relates to a method of chemically mechanically polishing (CMP) an $Al_xGa_yIn_zN$ wafer at its Ga-side, using a CMP slurry comprising:

abrasive colloidal alumina particles having particle size of less than 200 nm;

at least one acid; and optionally, at least one oxidation agent;

wherein the pH value of the CMP slurry is in a range of from about 3 to about 5.

The abrasive colloidal alumina particles in the CMP slurry preferably have particle sizes in a range from about 10 nm to about 100 nm.

The CMP slurry of the invention in a preferred compositional aspect comprises at least one oxidation agent, e.g., hydrogen peroxide, dichloroisocyanuric acid, or the like.

The pH value of such CMP slurry preferably is in a range of from about 3 to about 4.

A further aspect of the present invention relates to chemical mechanical polishing (CMP) of the $Al_xGa_yIn_zN$ wafer at its Ga-side, using a CMP slurry that comprises:

amorphous silica particles having particle sizes of less than 200 nm;

at least one base; and optionally, at least one oxidation agent, wherein the pH value of the CMP slurry is in a range from about 8 to about 13.5.

The amorphous silica particles in such CMP slurry preferably comprise fumed silica particles having particle sizes in the range from about 10 nm to about 100 nm, or colloidal silica particles having particle sizes in the range from about 10 nm to about 100 nm.

Bases useful for the practice of the present invention include, but are not limited to, ammonia, alkanolamines, and hydroxides, e.g., KOH or NaOH. Ammonia and alkanolamines are particularly preferred, since they also function to stabilize the CMP slurry.

Such CMP slurry comprises at least one oxidation agent, e.g., hydrogen peroxide, dichloroisocyanuric acid or the like.

The pH value of such CMP slurry preferably is in a range of from about 9 to about 13, and more preferably the pH is in a range of from about 10 to about 11.

A further aspect of the present invention relates to a method of highlighting crystal defects of an $Al_xGa_yIn_zN$ wafer at it Ga-side to facilitate determination of crystal defect density of such wafer, comprising the steps of:

provides an $Al_xGa_yIn_zN$ wafer;

chemically mechanically polishing the wafer at its Ga-side, according to one of the above-described CMP methods of the invention;

cleaning and drying the polished $Al_xGa_yIn_zN$ wafer; and scanning the wafer with an atomic force microscope or a scanning electron microscope to determine defect density in the wafer.

The CMP process is preferably conducted using an acidic silica slurry as described hereinabove.

Yet another aspect of the present invention relates to a method of fabricating high quality $Al_xGa_yIn_zN$ wafers, comprising the steps of:

providing an $Al_xGa_yIn_zN$ wafer blank having thickness in a range of from about 100 μm to about 1000 μm;

optionally reducing internal stresses of the $Al_xGa_yIn_zN$ wafer;

optionally lapping the $Al_xGa_yIn_zN$ wafer blank at its N-side, using a lapping slurry comprising abrasives having an average particle size in a range of from about 5 μm to about 15 μm;

optionally mechanically polishing the $Al_xGa_yIn_zN$ wafer blank at its N-side, using a mechanical polishing slurry comprising abrasives having average particle size in a range of from about 0.1 μm to about 6 μm;

optionally lapping the $Al_xGa_yIn_zN$ wafer blank at its Ga-side, using a lapping slurry comprising abrasives having an average particle size in a range of from about 5 μm to about 15 μm;

mechanically polishing the $Al_xGa_yIn_zN$ wafer blank at its Ga-side, using a mechanical polishing slurry comprising abrasives having average particle size in a range of from about 0.1 μm to about 6 μm;

chemically mechanically polishing the $Al_xGa_yIn_zN$ wafer at its Ga-side, using a CMP slurry comprising at least one chemical reactant and abrasive colloidal particles having average particle size of less than 200 nm; and optionally mild etching to further reduce internal stresses of the $Al_xGa_yIn_zN$ wafer and. improve the surface quality, wherein the resultant $Al_xGa_yIn_zN$ wafer has a root mean square (RMS) surface roughness of less than 1 nm in a 10×10 μm$^2$ area at its Ga-side.

The $Al_xGa_yIn_zN$ wafer blank may be produced by any suitable method, as for example: (1) growing an $Al_xGa_yIn_zN$ boule and then slicing it into wafer blanks; or (2) growing a thick $Al_xGa_yIn_zN$ film on a foreign substrate and then separating such thick film from the substrate. The wafer blank may be oriented so that the c-axis is perpendicular to the wafer surface or it may be intentionally slightly misoriented (c-axis not perpendicular to the wafer surface) to facilitate subsequent epitaxy growth, device processing or device design.

The $Al_xGa_yIn_zN$ wafer blank may be subjected to processing for reducing the internal stress caused, for example, by the disparity of thermal coefficients and lattice constants between such $Al_xGa_yIn_zN$ wafer and the foreign substrate on which it is grown. Reduction of internal stress may be conducted either by thermally annealing the $Al_xGa_yIn_zN$ wafer or chemically etching the wafer.

Thermal annealing preferably is carried out at an elevated temperature, e.g., from about 700° C. to about 1000° C., in nitrogen or ammonia environment for a time of from about 1 minute to about 1 hour.

Chemical etching of the $Al_xGa_yIn_zN$ wafer functions to remove a layer of surface material from said wafer, thereby relaxing the internal stress of said wafer. It is preferred that the chemical etching process effect a removal of surface material of less than 100 μm in thickness of said wafer, and more preferably less than 10 μm thickness.

The $Al_xGa_yIn_zN$ wafer can be chemically etched either by a very strong acid at elevated temperatures, e.g., sulfuric acid, phosphoric acid, or combinations thereof, or by a very strong base at elevated temperatures, e.g., molten KOH or NaOH.

Lapping slurry compositions advantageously used in the practice of the present invention may comprise any suitable abrasives, including, but not limited to, diamond powders, silicon carbide powders, boron carbide powders, and alumina powders. Preferably, the lapping slurry comprises diamond powder having average particle size in the range from about 6 μm to about 10 μm. More preferably, two or more lapping slurries lap the AlxGayInzN wafer blank, with each subsequent lapping slurry comprising abrasives of a progressively smaller average size. For example, the $Al_xGa_yIn_zN$ wafer blank may be lapped by a first slurry comprising abrasives of an average size from about 8 μm to about 10 μm, and then by a second slurry comprising abrasives of an average size from about 5 μm to about 7 μm.

Similarly, the mechanical polishing slurry useful in the present invention may comprise any suitable abrasives, including but not limited to diamond powders, silicon carbide powders, boron carbide powders, and alumina powders. Diamond powders with average particle size in the range from about 0.1 μm to about 3 μm are particularly preferred. The mechanical polishing step may also employ two or more mechanical polishing slurries, with each subsequent mechanical polishing slurry comprising abrasives of a progressively smaller particle size. For example, a first mechanical polishing slurry comprising abrasives of an average size from about 2.5 μm to about 3.5 μm can be used, followed by a second mechanical polishing slurry comprising abrasives of an average size from about 0.75 μm to about 1.25 μm, followed by a third mechanical polishing slurry comprising abrasives of an average size from about 0.35 μm to about 0.65 μm, followed by a fourth mechanical polishing slurry comprising abrasives of an average size from about 0.2 μm to about 0.3 μm, and finally by a fifth mechanical polishing slurry comprising abrasives of an average size from about 0.1 μm to about 0.2 μm.

The CMP slurry comprises at least one chemical reactant, which can be either an acid or a base. When it is an acid, it is preferable to adjust the pH value of the CMP slurry to a value in a range of about 0.5 to about 4; if it is instead a base, it is preferable to adjust the pH value of such slurry to a value in a range of from about 8 to about 13.5.

After the CMP, the $Al_xGa_yIn_zN$ wafer may be subjected to additional processing for further reducing the stress of the wafer and improving the surface quality. A mild etching is preferred for this purpose. The mild etching may remove some residual surface damage on the Ga-side surface from final CMP polishing while not etch the undamaged surface of Ga-side, thus improve the surface quality. The mild etching can also remove the damage on the N-side surface, thus reduce the stress on the wafer caused by surface damage. This mild etching can also produce a mat finish on the N-side surface. For example, the wafer can be slightly etched in an aqueous solution of base (for example, KOH or NaOH) or an aqueous solution of acid (for example, HF, $H_2SO_4$, or $H_3PO_4$) at a temperature below the boiling point of the aqueous solution, typically about 100° C.

Other aspects, features, and embodiments of the invention will be more fully apparent from the ensuing disclosure and appended claims.

BRIEF DESCRIPTION OF THE DRAWINGS

FIG. 1 is a Normaski optical micrograph (x100) of a GaN surface after being chemically mechanically polished with acidic colloidal silica CMP slurry (pH=0.8) for 1 hour and cleaned in diluted hydrofluoric acid.

FIG. 2 is an atomic force microscopy (AFM) image of the GaN surface shown in FIG. 1.

DETAILED DESCRIPTION OF THE INVENTION, AND PREFERRED EMBODIMENTS THEREOF

Figure 3:
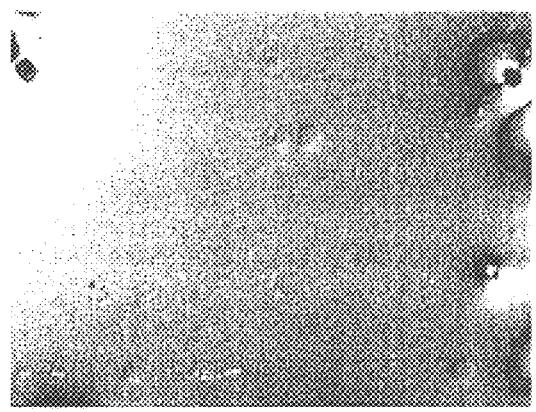
FIG. 3 is an AFM image of a GaN surface after being chemically mechanically polished with acidic colloidal alumina CMP slurry (pH=3.6) comprising hydrogen peroxide as oxidization agent for 1 hour and cleaned with diluted hydrofluoric acid.

Fabrication of high quality $Al_xGa_yIn_zN$ wafers in accordance with the present invention is readily achieved by processing steps as hereinafter more fully described, including fabrication of freestanding $Al_xGa_yIn_zN$ wafer blanks, lapping, mechanical polishing, chemical mechanical polishing, and reduction of internal stress.

Freestanding $Al_xGa_yIn_zN$ wafer blanks are obtained by any of various suitable methods. One method involves first growing an $Al_xGa_yIn_zN$ boule and then slicing it into wafer blanks. Another method for producing $Al_xGa_yIn_zN$ wafer blanks utilizes the steps of: (1) growing a thick $Al_xGa_yIn_zN$ film on a foreign substrate, using a suitable method such as hydride vapor phase epitaxy (HVPE), the metallorganic chloride (MOC) method, metallorganic chemical vapor deposition (MOCVD), sublimation, etc.; and then (2) removing the foreign substrate from the thick $Al_xGa_yIn_zN$ film, by polishing or etching the foreign substrate, by a laser-induced liftoff process, or other suitable technique.

By way of example, GaN films of about 400 $\mu$m thickness can be grown on sapphire substrates using HVPE process techniques.

Marks such as flats are made on the wafer to identify the crystal orientation of such wafer blank. The $Al_xGa_yIn_zN$ wafer blank can be sized into a round shape by, for example, particle beams, to facilitate subsequent mounting or processing of the wafer blank.

Mounting of the freestanding $Al_xGa_yIn_zN$ wafer blank to a fixture enables it to be readily lapped or polished as necessary. The wafer blank can be mounted on a template with recesses for holding the wafer blank. Alternatively, the wafer blank can be mounted on a flat template, by, for example (1) heating such template on a hotplate, (2) applying wax onto such template, and (3) pressing the wafer blank against the waxed template. After the template cools down, the wax solidifies and functions to hold the wafer blank on the template.

When the $Al_xGa_yIn_zN$ wafer blank is obtained from a $Al_xGa_yIn_zN$ boule and is relatively thick and uniform, a recessed template can be used for mounting such wafer blank, which is advantageous over waxed templates in respect of shorter process time, easier demounting, and less contamination.

On the other hand, for $Al_xGa_yIn_zN$ wafer blanks which may be more fragile, thinner, or less uniform in thickness, for example, wafer blank obtained from HVPE processes, the use of recessed templates may be less preferred due to the associated risk of breaking the $Al_xGa_yIn_zN$ wafer during the lapping and/or polishing process.

The fixture used for mounting the $Al_xGa_yIn_zN$ wafer blank can be of any suitable type appropriate to, and compatible with, the respective lapping or polishing apparatus. For purpose of improving thickness uniformity of the $Al_xGa_yIn_zN$ wafer, a special lapping fixture comprising three adjustable diamond stops defining a plane, can be utilized. The plane defined by the stops is parallel to the fixture surface, at a predetermined distance away from the surface. Such predetermined distance defines a minimum thickness of the lapped $Al_xGa_yIn_zN$ wafer, because the three diamond stops function as stop points preventing further removal of surface material from the $Al_xGa_yIn_zN$ wafer.

In the case that $Al_xGa_yIn_zN$ wafer blanks are slightly bowed or otherwise distorted due to internal stress present therein, it is preferable to dispose a weight on the wafer blank during the wafer being wax-mounted on the template. The type and amount of weight for such purpose is readily determinable within the skill of the art.

After the $Al_xGa_yIn_zN$ wafer blank is appropriately mounted, the wafer blank can be lapped by pressing it against a lapping plate, with abrasive particles embedded on surface of such lap plate, to produce a flat surface on the wafer. The pressure on the wafer may be adjusted to control the lapping process.

When using the same abrasives and lap plate rotation rates, the lapping rates of the AlxGaylnzN wafer blank increases with increasing particle size of the abrasive. Larger abrasive particles thus result in a higher lapping rate, but produce rougher lapped surfaces.

Lapping rates also depend on the hardness of abrasive material used. For example, diamond powders have higher lapping rates than silicon carbide powders, which in turn have higher lapping rates than alumina powders.

Lapping rates also depend on the type of lapping plates employed. For example, a copper lapping plate has a lower lapping rate than that of a cast iron plate, but the copper lapping plate yields a smoother lapped surface than that produced by the cast iron plate.

For an optimal lapping result, many factors, such as process time, surface finish, and manufacturing cost, have to be considered, and many combinations of abrasive material, particle size, lapping rate, and wafer pressure can be employed in the practice of the present invention. In order to reduce the probability of $Al_xGa_yIn_zN$ wafer cracking, a pressure below 5 psi, preferably 2 psi, is preferred. In order to reduce process time, a lapping rate above 50 µm/hr is preferred for stock removal. Among various kinds of abrasive materials, such as diamond, silicon carbide, boron carbide, and alumina, diamond slurry is preferred due to its high material removal rate and its production of better surface finishes.

Lapping of the $Al_xGa_yIn_zN$ wafer blank can be achieved either by a single step, or by multiple steps, with each subsequent lapping step using abrasives of progressively smaller particle sizes. After each lapping step, an optical microscope can be used to examine the surface to make sure that surface damage from previous steps has been substantially removed before proceeding to next step.

In one illustrative embodiment of the invention, a single lapping slurry is used, comprising 9 µm diamond abrasives, for lapping an $Al_xGa_yIn_zN$ wafer on a cast iron lapping plate under a pressure of I psi. The size of diamond abrasive particles is provided by the diamond slurry manufacturer, and is the average size of diamond particles in the slurry.

In another illustrative embodiment of the invention, two lapping slurries are used: the first lapping slurry comprises 9 µm diamond abrasive for lapping an $Al_xGa_yIn_zN$ wafer on a cast iron lapping plate, and the second slurry comprises 6 µm diamond abrasive for lapping the same wafer on a copper plate to achieve the desired surface finish.

After the $Al_xGa_yIn_zN$ wafer is lapped, it can be mechanically polished to achieve smooth surface morphology. During the mechanical polishing process, the $Al_xGa_yIn_zN$ wafer is pressed against a polishing pad with abrasive particles. Polishing process typically yields better surface finish than lapping, even for with same sized diamond slurry. Polishing can be achieved either by a single step, or by multiple steps, with each subsequent polishing step using abrasives of progressively smaller particle sizes.

Figure 8:
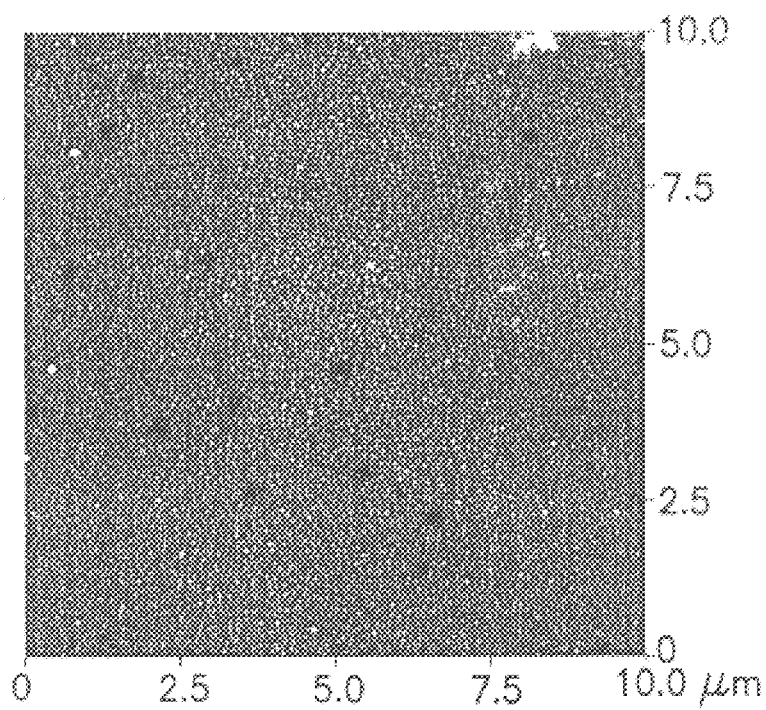
FIG. 8 is a Normaski optical micrograph (×100) of a GaN surface after being mechanically polished with 1 $\mu$m diamond slurry until mirror finish was achieved.
Figure 9:
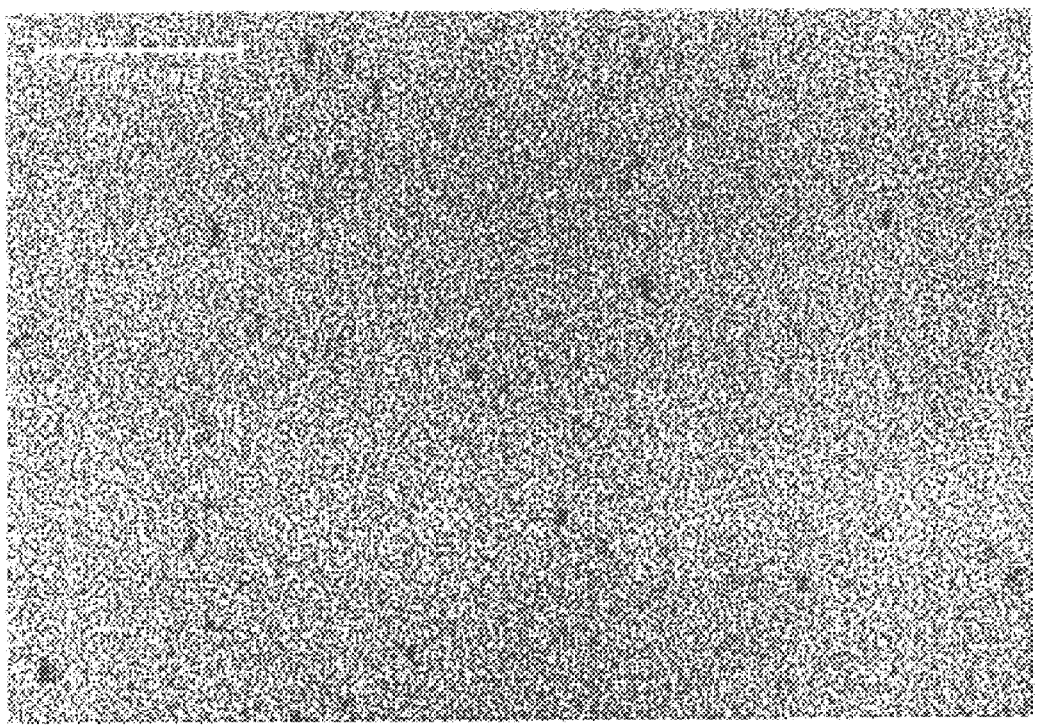
FIG. 9 is an AFM image of the GaN surface shown in FIG. 8.

After the mechanical polishing process, the $Al_xGa_yIn_zN$ wafer surface becomes relatively smooth. FIG. 8 shows a Normaski optical micrograph (x100) of a GaN surface after being mechanically polished with 1 µm diamond slurry until mirror finish has been achieved. However, such $Al_xGa_yIn_zN$ wafer is not suitable for homoepitaxial growth of $Al_xGa_yIn_zN$ crystals, since it still has significant surface and subsurface damage. The surface damage is characterized by dense polishing scratches that are visible under the atomic force microscope (AFM), as shown in FIG. 9.

To remove such surface and subsurface damage and polishing scratches, chemical mechanical polishing (CMP) of the $Al_xGa_yIn_zN$ wafer is preferred.

A first CMP slurry effective for chemically mechanically polishing the Ga-side of the $Al_xGa_yIn_zN$ wafer comprises an acid and abrasive amorphous silica particles, such as fumed silica or colloidal silica, having particle sizes of less than 200 nm. The pH value of such CMP slurry preferably is in a range from about 0.5 to about 4. Preferably, such CMP slurry also comprises an oxidization agent, such as hydrogen peroxide, dichloroisocyanuric acid or the like.

FIGS. 1 and 2 show a Normaski optical micrograph and an AFM image of a GaN wafer chemically mechanically polished using an acidic colloidal silica slurry having a pH value of 0.8 for about 1 hour. The GaN wafer was first polished with 1 µm diamond slurry before CMP. Besides a few defects from the substrate, the GaN surface is very smooth, with RMS surface roughness of about 0.15 nm in a $2 \times 2$ µm$^2$ area and about 0.5 nm in a $10 \times 10$ µm$^2$ area. Further, a previously unseen step structure is observed on the GaN surface under AFM. The presence of such step structure is an indication that the CMP process has been successful in removing polishing scratches from previous mechanical polishing. The CMP rate using such slurry can for example be on the order of about 2 µm/hr.

To further ascertain that the CMP process has also removed the subsurface damage on the surface, the wafer after CMP process is etched with a strong etchant, $H_3PO_4$ at 180° C. for 5 minutes. At this etching condition, crystal defects as well as surface and subsurface damage on the Ga-side of GaN surface will be etched at a greater rate than good crystalline material, producing etching pits. The size and number of the pits can be studied with atomic force microscope. After hot $H_3PO_4$ etching, the CMP polished wafers show some etching pits, but the density of the etching pits is the same as the density of pits evident in the CMP polished surface. The size of the pits has increased, however. For comparison, a wafer that is not completely polished with the CMP process (i.e., shorter CMP process time and therefore polishing damage remains) shows more etching pits after etching with $H_3PO_4$ at 180° C. for 5 minutes, and many of the pits follow a line, indicating that the surface and subsurface damage is not completely removed if the CMP process is not complete.

Oxidation agents can advantageously be added to the acidic CMP slurry. When hydrogen peroxide or dichloroisocyanuric acid is used as an oxidation agent, the polishing rate is above 2 µm/hr, with RMS surface roughness being below 0.2 in a $2 \times 2$ µm$^2$ area and below 0.5 nm in a $10 \times 10$ µm$^2$ area. The step structures on the $Al_xGa_yIn_zN$ wafer surface are readily observed under AFM.

A second CMP slurry effective for chemically mechanically polishing the Ga-side of the $Al_xGa_yIn_zN$ wafer comprises an acid and abrasive colloidal alumina particles having particle sizes of less than 200 nm. The pH value of such CMP slurry preferably is in a range from about 3 to about 4. Preferably, such CMP slurry also comprises an oxidization agent, such as hydrogen peroxide, dichloroisocyanuric acid or the like.

FIG. 3 shows an AFM image of a GaN surface after being chemically mechanically polished with acidic colloidal alumina CMP slurry (pH=3.6) comprising hydrogen peroxide as oxidization agent for 1 hour. The step structure is observed under AFM, demonstrating that acidic colloidal alumina slurry is effective for removing mechanical damage from the GaN surface. However, at the same polishing operation conditions, colloidal alumina-based slurry has a much lower polishing rate (about 0.1 µm/hr) than that of the silica-based slurries. Because of slow polishing rate, many polishing scratches are still present after 1 hour of polishing with the acidic colloidal alumina CMP slurry. A much longer polishing time is needed to completely remove the surface/subsurface damage with the colloidal alumina-based slurry.

A third CMP slurry effective for chemically mechanically polishing the Ga-side of the $Al_xGa_yIn_zN$ wafer comprises a base and amorphous silica particles, either fumed silica or colloidal silica, having particle sizes of less than 200 nm. The pH value of such CMP slurry is in a range of from about 8 to about 13.5.

Figure 4:
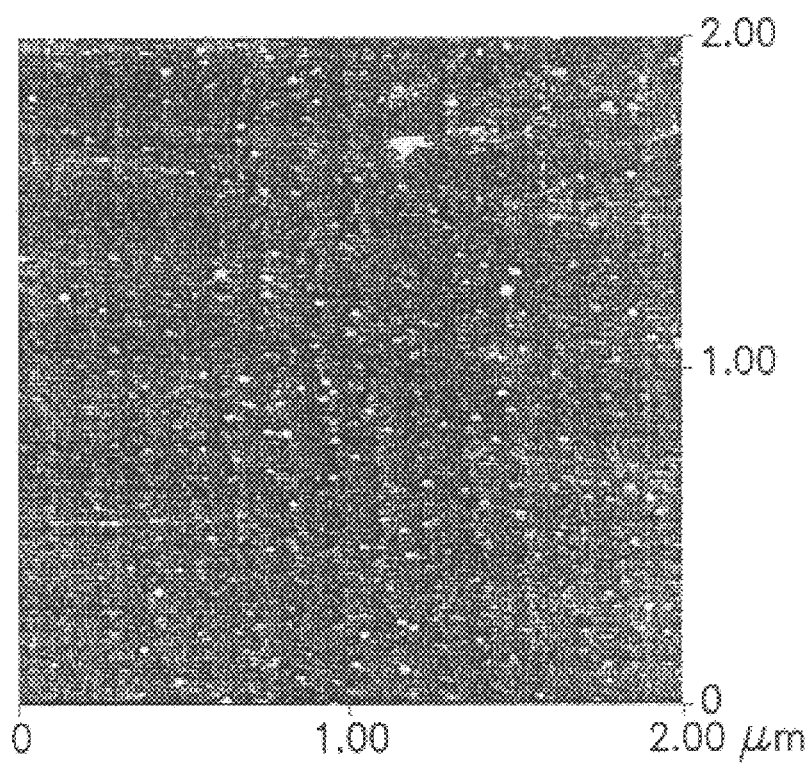
FIG. 4 is a Normnaski optical micrograph (x100) of a GaN surface after being chemically mechanically polished with basic colloidal silica CMP slurry (pH=11.2) for 1 hour and cleaned in diluted hydrofluoric acid.
Figure 5:
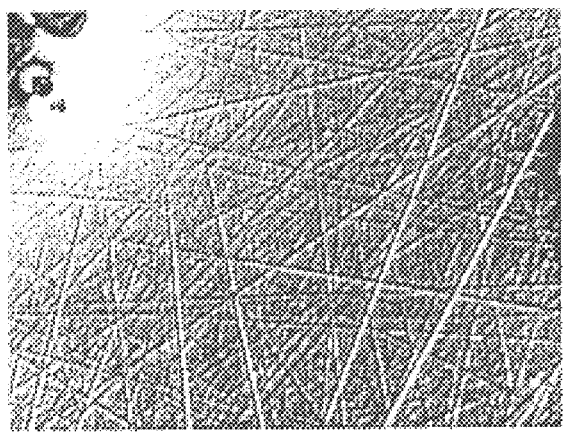
FIG. 5 is an AFM image of the GaN surface shown in FIG. 4.

FIGS. 4 and 5 show a Normaski optical micrograph and an AFM image of a GaN wafer chemically mechanically polished using a basic colloidal silica slurry having a pH value of 11.2 for about 1 hour. The surface appears rougher and has significantly more scratches when polished, in comparison with the surface finish achieved with an acidic silica slurry. Moreover, the scratches are larger and deeper than those of the GaN surface after mechanical polishing with diamond slurry comprising 1 μm diamond powders, indicating that larger particles or particle agglomerations are present in the basic silica slurry. Interestingly, step structures are also observed. The presence of step structures indicates that surface damage from previous mechanical polishing has been removed, but the presence of larger particles in the slurry introduces new damage. It therefore is desirable to filter the basic silica slurry before polishing to remove large particles and to ensure that the abrasive particles in such slurry have particle sizes of less than 200 nm.

Besides using hydroxides for pH alteration, the pH of the basic silica slurry can be adjusted with ammonia or alkanolamine. Ammonia- or alkanolamine-stabilized slurries provide smoother polished surfaces and therefore are preferred over hydroxide-based slurries.

To improve the stability of the CMP process, it may be advantageous to control the ambient humidity and temperature during the CMP process.

After chemical mechanical polishing, the $Al_xGa_yIn_zN$ wafer can be cleaned and dried, using techniques known in the art. A mild etching can also be used to remove any remaining surface and subsurface damage from the final polished wafer. The condition for the mild etching is chosen to remove some residual surface damage on the Ga-side surface from final polishing while not etching or etching to a limited degree the undamaged surface of Ga-side. The mild etching can also remove the damage on the N-side surface to reduce the stress on the wafer caused by damage on the N-surface. This mild etching can also produce a mat finish on the N-surface. For example, the wafer can be slightly etched in an aqueous solution of base (for example, KOH or NaOH) or an aqueous solution of acid (for example, HF, $H_2SO_4$, or $H_3PO_4$) at a temperature of below 100° C.

$Al_xGa_yIn_zN$ wafers may suffer from internal stresses, which cause the wafer to bow or to warp. Thermal annealing or chemical etching of the AlxGayInzN wafer, which can be performed before, after or between the steps of the wafer fabrication sequence, can relax such internal stresses.

In the case that the $Al_xGa_yIn_zN$ wafer have large pits on its surface and contaminants are trapped in the pits from the fabrication process, it is beneficial to have a chemical etching and cleaning step to remove the contaminants from the pits between the steps of wafer fabrication.

In one embodiment of the present invention, the $Al_xGa_y$-$In_zN$ wafer is subjected to thermal annealing at temperature up to 1000° C. in nitrogen ambient. Preferably, the annealing temperature is in a range of from about 700° C. to about 1000° C., and the duration of the thermal annealing is in a range of from about 1 minute to about 1 hour.

In another embodiment of the invention, the $Al_xGa_yIn_zN$ wafer is subjected to chemical etching, which preferentially removes damaged surface material from the $Al_xGa_yIn_zN$ wafer and reduces wafer bow and warp caused by surface damage.

Chemical etching of $Al_xGa_yIn_zN$ wafer can be accomplished by immersing the wafer in very strong acids or bases at an elevated temperature. Sulfuric acid or phosphoric acid at a temperature above 150° C. can etch the $Al_xGa_yIn_zN$ wafer. Alternatively, molten potassium or sodium hydroxide can also etch the $Al_xGa_yIn_zN$ wafer. The etching conditions, such as etching temperature and etching time, are preferably controlled to yield removal of surface material of less than 100 μm in thickness, and preferably less than 10 μm in thickness.

After chemical mechanical polishing of a GaN surface, for example, using acidic silica CMP slurry (pH=0.8) for about 1 hr., small pits are formed, which may originate from dislocations in the crystal lattice of the GaN wafer. The diameter of the pits is typically below 1 μm, and more typically below 0.5 μm. The pits appear round without clear edges when imaged with atomic force microscope. When the wafer has been completely CMP polished and is subjected to etching, for example, with $H_3PO_4$ at 180° C. for 5 minutes, the size of the pits is increased, but the density of the pits remain the same, i.e., no more pits are produced. Furthermore, the pits formed from etching the CMP polished wafer appear hexagonal when imaged with atomic force microscope.

Figure 6:
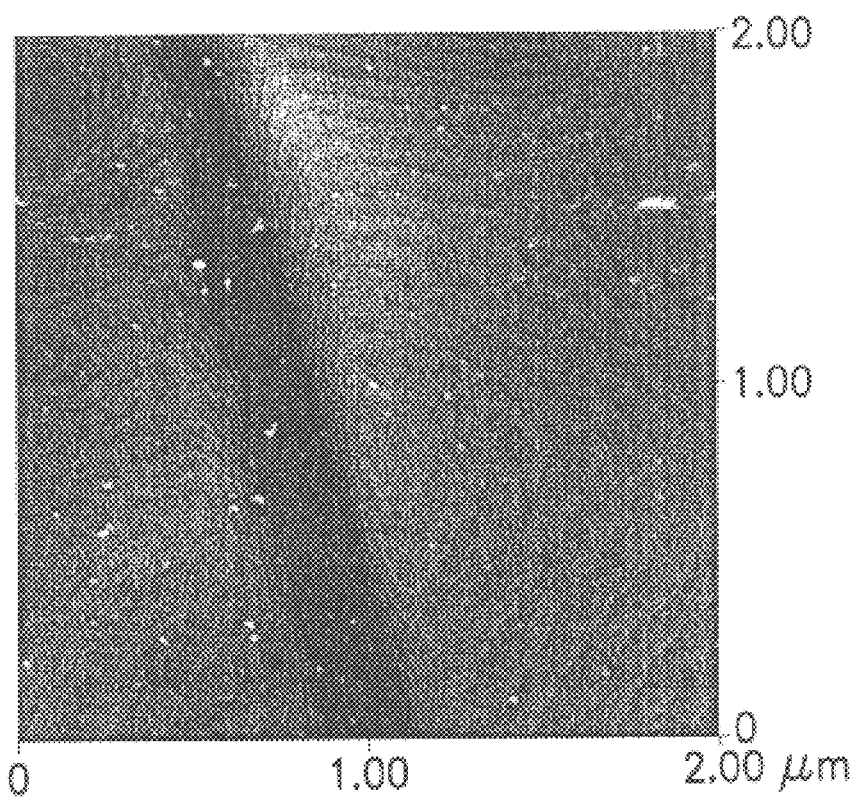
FIG. 6 is an AFM image of a GaN surface after being chemically mechanically polished with acidic silica CMP slurry (pH=0.8) for 1 hour and cleaned in diluted hydrofluoric acid.

FIG. 6 shows an AFM image of a GaN surface, with clearly visible pits. The GaN surface was chemical mechanically polished using acidic colloidal silica CMP slurry (pH=0.8) for about 1 hour.

Figure 7:
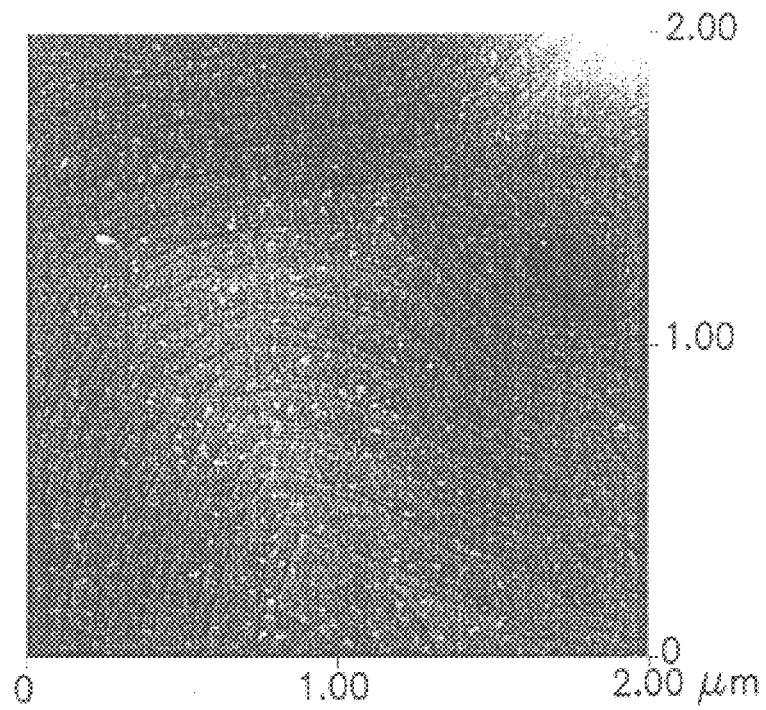
FIG. 7 is a scanning electron microscopy (SEM) micrograph of a GaN surface after being chemically mechanically polished with acidic silica CMP slurry (pH=0.8) for 1 hour and cleaned in diluted hydrofluoric acid.

FIG. 7 also shows a scanning electron microscopic (SEM) image of a GaN wafer, polished by acidic colloidal silica CMP slurry (pH=0.8) for 1 hour, with visible pits that can be counted for determining the defect density of such GaN wafer. Without chemical mechanical polishing of the GaN wafer surface, such pits are not observed with AFM or with SEM.

It thus is possible to use a CMP process to prepare an $Al_xGa_yIn_zN$ wafer to highlight crystal defects for subsequent determination of defect density by AFM or SEM techniques.

This defect highlight technique is superior to other techniques such as transmission electron microscope (TEM), wet-chemical etching, and photo electrochemical etching. Such etch techniques are generally conducted under harsh etching conditions, making the etched $Al_xGa_yIn_zN$ wafer unsuitable for subsequent epitaxial growth of $Al_xGa_yIn_zN$ crystalline material thereon.

By contrast, the use of a CMP process for highlighting crystal defects does not damage the crystal surface of the $Al_xGa_yIn_zN$ wafer and therefore permits subsequent crystal growth.

EXAMPLE 1

A GaN film several hundred microns thick was grown on a sapphire substrate by an HVPE process and then separated from the sapphire substrate. The resultantly formed freestanding GaN wafer blank exhibited a textured Ga-surface with a RMS roughness of about 4 nm in a 2×2 μm² area.

The GaN wafer blank was then polished at the Ga-side with an acidic silica slurry without undergoing a lapping process.

After polishing, it was observed that the surface morphology of such GaN wafer was greatly improved, with the textured surface being entirely removed. The RMS roughness was reduced to below 0.3 nm in a 2×2 μm² area.

EXAMPLE 2

Thick GaN films with thickness in the range from 200–500 microns were grown on 2" sapphire substrates by an HVPE process. The GaN films then were separated from the sapphire substrate, to yield freestanding GaN wafer blanks.

Flats for the GaN films were marked as 30° off the sapphire substrate's flat. The GaN wafer blanks then were sized into wafer shapes with diameter of 30, 35, and 40 mm using a particle beam jet. To prevent wafer breakage during wafer sizing, it was preferable to mount the GaN wafer on a glass plate of at least 1 mm thickness, using wax.

Nine GaN wafers were mounted on a lap fixture with wax with the N-side facing the lap fixture. A steel block was placed on top of each wafer while the wax cooled. The GaN wafers were first lapped on the Ga-side with diamond slurry of 9 μm in diameter on a cast iron lapping plate. Before lapping, a large thickness variation existed between the wafers and within each wafer. After lapping, uniformity of wafer thickness was greatly improved.

The wafers then were removed from the lapping fixture, and Wax-mounted on a mechanical polishing fixture. Each wafer was polished with diamond slurry of 3 μm in diameter until mirror finish was achieved. Under optical microscope examination, all surface damage from the lapping process was removed.

After mechanical polishing, the wafers were chemically mechanically polished with acidic colloidal silica slurry. A Nomarski optical microscope was used to examine the polished surfaces, to verify that the CMP process removed all mechanical polishing scratches.

EXAMPLE 3

Three GaN wafer blanks were mounted on a lap fixture with wax with the Ga-side facing the lap fixture. A steel block was placed on top of each wafer while the wax cooled. The GaN wafers were first lapped on the N-side with diamond slurry of 9 μm in diameter on a Lapmaster 15 lapping machine with cast iron lapping plate until a uniform mat finish was achieved.

After the N-side was lapped, the GaN wafers were removed from the lap fixture by heating on a hot plate. The wafers were cleaned and mounted on a lap fixture with wax with the N-side facing the lap fixture. A steel block was placed on top of each wafer while the wax cooled. The GaN wafers were lapped on the Ga-side with diamond slurry of 9 μm in diameter on a cast iron lapping plate until a desirable wafer thickness was obtained. Subsequently, the GaN wafers were lapped with diamond slurry of 6 μm in diameter on a copper lapping plate until surface features from the previous lapping step were removed.

After lapping, the three wafers were mechanically polished with diamond slurry of 1 μm in diameter on a Buehler ECOMET polisher until the surface features from the previous lapping step were removed.

After mechanical polishing, the three wafers were chemical mechanically polished with an acidic colloidal silica slurry on a Beuhler ECOMET polisher. The acidic colloidal silica slurry was prepared by mixing 2 parts of 1 molar aqueous hydrochloric acid with 1 part of commercial silica slurry, Nalco 2350 polishing slurry. A Nomarski optical microscope was used to examine the polished surfaces, to verify that the CMP process removed all mechanical polishing scratches.

After CMP process, the wafers were removed from the polish fixture and cleaned. The wafers were also cleaned in diluted hydrofluoric acid to remove any residual colloidal silica particles on the wafer surface. The wafers were imaged with atomic force microscope (Digital Instruments NanoScope III) to determine the density of the pits and the smoothness of the surface. For one wafer, the RMS roughness was 0.11 nm in a 2×2 $\mu m^2$ area and 0.28 nm in a 10×10 $\mu m^2$ area. The pit density for the three wafers was about $10^6$–$10^7$ pits/cm$^2$, and the pit size was about less than 0.4 μm in diameter.

The GaN wafers of the present invention can be used to construct optoelectronic devices such as light emitting diodes and blue light lasers. Such devices are important as the blue light emitting diodes (LED's) and lasers are an enabling technology, allowing much higher storage density in magneto-optic memories and CDROM's and the construction of full color light emitting displays. Such devices can replace today's incandescent light bulbs in road and railway signals etc., where they promise very substantial cost and energy savings.

The invention has been described herein with reference to specific features, aspects, and embodiments. It will be appreciated that the applicability of the invention is not thus limited, but readily extends to and encompasses numerous variations, modifications, and other embodiments, as will readily suggest themselves to those of ordinary skill in the art. Accordingly, the invention is to be broadly construed, consistent with the claims hereafter set forth.

What is claimed is:

1. A wafer comprising $Al_xGa_yIn_zN$, wherein $0<y\leq 1$ and $x+y+z=1$, characterized by a root mean square (RMS) surface roughness of less than 1 nm in a 10×10 $\mu m^2$ area at the Ga-side of the wafer.

2. The wafer of claim 1, wherein the RMS surface roughness of said wafer is less than 0.7 nm in a 10×10 $\mu m^2$ area at the Ga-side of the wafer.

3. The wafer of claim 1, wherein the RMS surface roughness of said wafer is less than 0.5 nm in a 10×10 $\mu m^2$ area at the Ga-side of the wafer.

4. The wafer of claim 1, wherein the RMS surface roughness of said wafer is at least less than 0.4 nm in a 2×2 $\mu m^2$ area at the Ga-side of the wafer.

5. The wafer of claim 1, wherein the RMS surface roughness of said wafer is less than 0.2 nm in a 2×2 $\mu m^2$ area at the Ga-side of the wafer.

6. The wafer of claim 1, wherein the RMS surface roughness of said wafer is less than 0.15 nm in a 2×2 $\mu m^2$ area at the Ga-side of the wafer.

7. The wafer of claim 1, characterized by a step structure at its Ga-side when observed with an atomic force microscope.

8. The wafer of claim 1, wherein the crystal defects at its Ga-side are visible as small pits with diameters of less than 1 μm.

9. The wafer of claim 1, formed by chemically mechanically polishing (CMP) an $Al_xGa_yIn_zN$ wafer blank at the Ga-side thereof, using a silica- or alumina-containing CMP slurry.

10. An epitaxial $Al_xGa_yIn_zN$ crystal structure, comprising an epitaxial $Al_{x'}Ga_{y'}In_{z'}N$ thin film grown on a wafer comprising $Al_xGa_yIn_zN$ wherein $0<y'\leq 1$, $x'+y'+z'=1$, $0<y\leq 1$, and $x+y+z=1$, said wafer being characterized by a root mean square (RMS) surface roughness of less than 1 nm in a 10×10 μm area at the Ga-side of the wafer.

11. The epitaxial $Al_xGa_yIn_zN$ crystal structure of claim 10, comprising a wurtzite crystalline thin film.

12. The epitaxial $Al_xGa_yIn_zN$ crystal structure of claim 10, where the epitaxial $Al_{x'}Ga_{y'}In_{z'}N$ thin film has the same composition as the wafer comprising $Al_xGa_yIn_zN$.

13. The epitaxial $Al_xGa_yIn_zN$ crystal structure of claim 10, where the epitaxial $Al_{x'}Ga_{y'}In_{z'}N$ thin film has a different composition from the wafer comprising $Al_xGa_yIn_zN$.

14. The epitaxial $Al_xGa_yIn_zN$ crystal structure of claim 10, where the epitaxial $Al_{x'}Ga_{y'}In_{z'}N$ thin film has a graded composition.

15. An epitaxial $Al_xGa_yIn_zN$ crystal boule grown on a wafer comprising $Al_xGa_yIn_zN$, wherein $0<y\leq 1$ and $x+y+z=1$, said wafer being characterized by a root mean square (RMS) surface roughness of at least less than 1 nm in a 10×10 $\mu m^2$ area at a Ga-side of the wafer.

16. The epitaxial $Al_xGa_yIn_zN$ crystal boule of claim 15, where the boule is grown in gas phase.

17. The epitaxial $Al_xGa_yIn_zN$ crystal boule of claim 15, where the boule is grown in liquid phase.

18. An optoelectronic device comprising at least one epitaxial $Al_xGa_yIn_zN$ crystal structure grown on a wafer comprising $Al_xGa_yIn_zN$ wherein $0<y\leq 1$ and $x+y+z=1$, said wafer being characterized by a root mean square (RMS) surface roughness of at least less than 1 nm in a $10\times 10\ \mu m^2$ area at a Ga-side of the wafer.

19. The optoelectronic device of claim 18, wherein the optoelectronic device is a light emitting diode.

20. The optoelectronic device of claim 18, wherein the optoelectronic device is a blue light laser diode.

21. The optoelectronic device of claim 18, wherein the optoelectronic device is incorporated into a light emitting diode.

22. The optoelectronic device of claim 18, wherein the optoelectronic device is incorporated into a magneto-optic memory device.

23. The optoelectronic device of claim 18, wherein the optoelectronic device is incorporated into a full color light emitting displays light.

24. The optoelectronic device of claim 18, wherein the optoelectronic device is incorporated into a DVD device.

25. A microelectronic device comprising at least one epitaxial $Al_xGa_yIn_zN$ crystal structure grown on a wafer comprising $Al_xGa_yIn_zN$ wherein $0<y\leq 1$ and $x+y+z=1$, said wafer being characterized by a root mean square (RMS) surface roughness of at least less than 1 nm in a $10\times 10\ \mu m^2$ area at a Ga-side of the wafer.

26. A method of chemically mechanically polishing (CMP) an $Al_xGa_yIn_zN$ wafer at a Ga-side thereof, wherein $0<y\leq 1$ and $x+y+z=1$, using a CMP slurry comprising:
   abrasive amorphous silica particles having particle sizes of less than 200 nm;
   at least one acid; and
   optionally, at least one oxidation agent;
   wherein the pH value of the CMP slurry is in a range of from about 0.5 to about 4.

27. The method of claim 26, wherein the CMP slurry comprises fumed silica having particle sizes in a range from about 10 nm to about 100 nm.

28. The method of claim 26, wherein the CMP slurry comprises colloidal silica having particle sizes in a range from about 10 nm to about 100 nm.

29. The method of claim 26, wherein the CMP slurry comprises an oxidation agent.

30. The method of claim 29, wherein the oxidation agent comprises hydrogen peroxide.

31. The method of claim 29, wherein the oxidation agent comprises dichloroisocyanuric acid.

32. The method of claim 26, wherein the CMP slurry has a pH. value in a range of from about 0.6 to about 3.

33. The method of claim 26, wherein the CMP slurry has a pH value in a range of from about 0.8 to about 2.5.

34. The method claim of 26, wherein the CMP slurry is filtered to remove particles larger than 100 nm in diameter before delivering to the polishing pad.

35. A method of chemically mechanically polishing (CMP) an $Al_xGa_yIn_zN$ wafer at a Ga-side thereof, wherein $0<y\leq 1$ and $x+y+z=1$, using a CMP slurry comprising:
   Abrasive colloidal alumina particles having particle sizes of less than 200 nm;
   at least one acid; and
   optionally, at least one oxidation agent;
   wherein the pH value of the CMP slurry is in a range of from about 3 to about 5.

36. The method of claim 35, wherein the CMP slurry comprises colloidal alumina having particle sizes in a range from about 10 nm to about 100 nm.

37. The method of claim 35, wherein the CMP slurry comprises an oxidation agent.

38. The method of claim 37, wherein the oxidation agent comprises hydrogen peroxide.

39. The method of claim 37, wherein the oxidation agent comprises dichloroisocyanuric acid.

40. The method of claim 35, wherein the CMP slurry has a pH value in a range of from about 3 to about 4.

41. The method claim 35, wherein the CMP slurry is filtered to remove particles larger than 100 nm in diameter before delivering to the polishing pad.

42. A method of chemically mechanically polishing (CMP) an $Al_xGa_yIn_zN$ wafer at a Ga-side thereof, wherein $0<y\leq 1$ and $x+y+z=1$, using a CMP slurry comprising:
   amorphous silica particles having particle sizes of less than 200 nm;
   at least one base; and
   optionally, at least one oxidization agent,
   wherein the pH value of the CMP slurry is in a range of from about 8 to about 13.5.

43. The method of claim 42, wherein the CMP slurry comprises colloidal silica having particle sizes in a range of from about 10 nm to about 100 nm.

44. The method of claim 42, wherein the CMP slurry comprises colloidal silica having particle sizes in a range of from about 10 nm to about 100 nm.

45. The method of claim 42, wherein the CMP slurry comprises a base selected from the group consisting of ammonia, alkanolamines, and hydroxides.

46. The method of claim 42, wherein the CMP slurry comprises ammonia.

47. The method of claim 42, wherein the CMP slurry comprises an alkanolamine.

48. The method of claim 42, wherein the CMP slurry comprises a hydroxide selected from the group consisting of KOH and NaOH.

49. The method of claim 42, wherein the CMP slurry comprises an oxidation agent.

50. The method of claim 49, wherein the oxidation agent comprises hydrogen peroxide.

51. The method of claim 49, wherein the oxidation agent comprises dichloroisocyanuric acid.

52. The method of claim 42, wherein the CMP slurry has a pH value in a range of from about 9 to about 13.

53. The method of claim 42, wherein the CMP slurry has a pH value in a range of from about 10 to about 11.

54. The method claim of 42, wherein the CMP slurry is filtered to remove particles larger than 100 nm in diameter before delivering to the polishing pad.

55. A method of determining crystal defect density in an $Al_xGa_yIn_zN$ wafer at a Ga-side thereof, wherein $0<y\leq 1$ and $x+y+z=1$, comprising the steps of:
   providing an $Al_xGa_yIn_zN$ wafer;
   chemically mechanically polishing said wafer at a Ga-side thereof, using a CMP slurry comprising abrasive amorphous silica articles having particle sizes of less than 200 nm, at least one acid, and optionally at least one oxidization agent, wherein the pH value of said CMP slurry is in a range of from about 0.5 to about 4;
   cleaning and drying the polished $Al_xGa_yIn_zN$ wafer; and
   scanning the wafer with an atomic force microscope or a scanning electron microscope to determine defect density in said wafer.

56. A method of fabricating wafers comprising $Al_xGa_yIn_zN$, wherein $0<y\leq 1$ and $x+y+z=1$, comprising the steps of:

provided an $Al_xGa_yIn_zN$ wafer blank having thickness in the range from about 100 µm to about 1000 µm;

optionally, reducing the internal stress of the $Al_xGa_yIn_zN$ wafer blank;

optionally, lapping the $Al_xGa_yIn_zN$ wafer blank at the N-side thereof, using a lapping slurry comprising abrasives having an average particle size in a range of from about 5 µm to about 15 µm;

optionally, mechanically polishing the $Al_xGa_yIn_zN$ wafer blank at its N-side, using a mechanical polishing slurry comprises abrasives having average particle size in a range of from about 0.1 µm to about 6 µm;

optionally, lapping the $Al_xGa_yIn_zN$ wafer blank at a Ga-side thereof, using a lapping slurry comprising abrasives having an average particle size in a range of from about 5 µm to about 15 µm;

mechanically polishing the $Al_xGa_yIn_zN$ wafer blank at its Ga-side, using a mechanical polishing slurry comprises abrasives having average particle size in a range of from about 0.1 µm to about 6 µm;

chemically mechanically polishing the $Al_xGa_yIn_zN$ wafer at its Ga-side, using a CMP slurry comprising at least one chemical reactant and abrasive particles having average particle size of less than 200 nm; and optionally, etching the $Al_xGa_yIn_zN$ wafer in a mild etching condition to further reduce internal stresses of the $Al_xGa_yIn_zN$ wafer, to improve surface quality, and to produce a mat finish at the N-side, wherein the $Al_xGa_yIn_zN$ wafer so fabricated has a surface roughness characterized by a root mean square (RMS) surface roughness of less than 1 nm in a 10×10 µm² area at its Ga-side.

57. The method of claim 56, wherein the $Al_xGa_yIn_zN$ wafer blank is produced by the steps of:

growing a thick $Al_xGa_yIn_zN$ film on a foreign substrate; and removing the foreign substrate from the thick $Al_xGa_yIn_zN$ film.

58. The method of claim 56, wherein the $Al_xGa_yIn_zN$ wafer blank is produced by the steps of:

growing an $Al_xGa_yIn_zN$ boule; and slicing the $Al_xGa_yIn_zN$ boule.

59. The method claim of 58, where the $Al_xGa_yIn_zN$ boule is sliced so that the wafer blank surface is perpendicular to the c-axis.

60. The method claim of 58, where the $Al_xGa_yIn_zN$ boule is sliced so that the wafer blank surface is intentionally not perpendicular to the c-axis.

61. The method of claim 56, wherein the internal stresses of the $Al_xGa_yIn_zN$ wafer are reduced by thermally annealing said wafer at an elevated temperature of from about 700° C. to about 1000° C. in nitrogen or ammonia environment for about 1 minute to about 1 hour.

62. The method of claim 56, wherein the internal stresses of the $Al_xGa_yIn_zN$ wafer are reduced by chemically etching, which results in removal of surface material of less than 100 µm thickness.

63. The method of claim 62, wherein surface material of less than 10 µm thickness is removed from the $Al_xGa_yIn_zN$ wafer.

64. The method of claim 62, wherein the $Al_xGa_yIn_zN$ wafer is chemically etched by a strong acid at a temperature above 150° C.

65. The method of claim 64, wherein the strong acid is selected from the group consisting of sulfuric acid, phosphoric acid, and combinations thereof.

66. The method of claim 62, wherein the $Al_xGa_yIn_zN$ wafer is chemically etched by a strong molten base at a temperature above 150° C.

67. The method of claim 66, wherein the strong base is selected from the group consisting of molten LiOH, molten NaOH, molten KOH, molten RbOH, molten CsOH, and combinations thereof.

68. The method of claim 56, wherein the $Al_xGa_yIn_zN$ wafer blank is lapped by a lapping slurry comprising abrasives selected from the group consisting of diamond powders, silicon carbide powders, boron carbide powders, and alumina powders.

69. The method of claim 56, wherein the lapping slurry comprises diamond powder having average particle size in a range of from about 6 µm to about 15 µm.

70. The method of claim 56, wherein the $Al_xGa_yIn_zN$ wafer blank is lapped at its Ga-side by two or more lapping slurries, with each subsequent lapping slurry comprising abrasives of a correspondingly smaller average size.

71. The method of claim 70, wherein the $Al_xGa_yIn_zN$ wafer blank is lapped by a first lapping slurry comprising abrasives of an average size of from about 8 µm to about 10 µm, and by a second lapping slurry comprising abrasives of an average size of from about 5 µm to about 7 µm.

72. The method of claim 56, wherein the mechanical polishing slurry comprises abrasives selected from the group consisting of diamond powders, silicon carbide powders, boron carbide powders, and alumina powders.

73. The method of claim 56, wherein the mechanical polishing slurry comprises diamond powders having average particle size in a range of from about 0.1 µm to about 6 µm.

74. The method of claim 56, wherein the $Al_xGa_yIn_zN$ wafer blank is mechanically polished by two or more mechanical polishing slurries, with each subsequent mechanical polishing slurry comprising abrasives of a progressively smaller average size.

75. The method of claim 74, wherein the $Al_xGa_yIn_zN$ wafer blank is mechanically polished by a first mechanical polishing slurry comprising abrasives of an average size of from about 2.5 µm to about 3.5 µm, by a second mechanical polishing slurry comprising abrasives of an average size of from about 0.75 µm to about 1.25 µm, by a third mechanical polishing slurry comprising abrasives of an average size of from about 0.35 µm to about 0.65 µm, by a fourth mechanical polishing slurry comprising abrasives of an average size of from about 0.2 µm to about 0.3 µm, and by a fifth mechanical polishing slurry comprising abrasives of an average size of from about 0.1 µm to about 0.2 µm.

76. The method of claim 56, wherein the CMP slurry is acidic, and the pH value of said CMP slurry is in a range of from about 0.5 to about 4.

77. The method of claim 56, wherein the CMP slurry is basic, and the pH value of said CMP slurry is in a range of from about 8 to about 13.5.

78. The method claim of 56, wherein the mild etching condition is selected from group consists of etching in aqueous acid solution and etching in aqueous base solution at a temperature below 100° C.

79. The method claim of 78, wherein the acid is selected from group consists of aqueous hydrofluoric acid, nitric acid, sulfuric acid, phosphoric acid, and combinations thereof.

80. The method claim of 78, wherein the base is selected from group consists of aqueous LiOH, NaOH, KOH, RbOH, CsOH, and combinations thereof.

* * * * *